(12) United States Patent
Svensson

(10) Patent No.: US 8,372,197 B2
(45) Date of Patent: Feb. 12, 2013

(54) SUBSTRATE TEMPERATURE ACCURACY AND TEMPERATURE CONTROL FLEXIBILITY IN A MOLECULAR BEAM EPITAXY SYSTEM

(75) Inventor: Stefan P. Svensson, Columbia, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 13/219,762

(22) Filed: Aug. 29, 2011

(65) Prior Publication Data

US 2012/0024222 A1 Feb. 2, 2012

Related U.S. Application Data

(62) Division of application No. 11/806,159, filed on May 30, 2007, now abandoned.

(51) Int. Cl.
*C30B 23/00* (2006.01)
*C30B 25/16* (2006.01)

(52) U.S. Cl. ............... 117/88; 117/84; 117/85; 117/86; 117/89; 117/92; 117/103

(58) Field of Classification Search ............... 117/84, 117/85, 86, 88, 89, 92, 103
See application file for complete search history.

(56) References Cited

U.S. PATENT DOCUMENTS

| 5,122,222 | A  | * | 6/1992  | Turner et al. ............... 117/86 |
| 5,238,525 | A  | * | 8/1993  | Turner et al. ............... 117/85 |
| 5,772,758 | A  | * | 6/1998  | Collins et al. ............... 117/85 |
| 6,830,942 | B1 | * | 12/2004 | Alers et al. ............... 438/16 |
| 2005/0063451 | A1 | * | 3/2005 | Abe et al. ............... 374/121 |

* cited by examiner

*Primary Examiner* — Matthew Song
(74) *Attorney, Agent, or Firm* — John H. Raubitschek

(57) ABSTRACT

A control system and method for controlling temperatures while performing a MBE deposition process, wherein the control system comprises a MBE growth structure; a heater adapted to provide heat for the MBE deposition process on the MBE growth structure; and a control computer adapted to receive a plurality of dynamic feedback control signals derived from the MBE growth structure; switch among a plurality of control modes corresponding with the plurality of dynamic feedback control signals; and send an output power signal to the heater to control the heating for the MBE deposition process based on a combination of the plurality of control modes. In one embodiment, the plurality of dynamic feedback control signals comprises thermocouple signals and pyrometer signals.

8 Claims, 8 Drawing Sheets

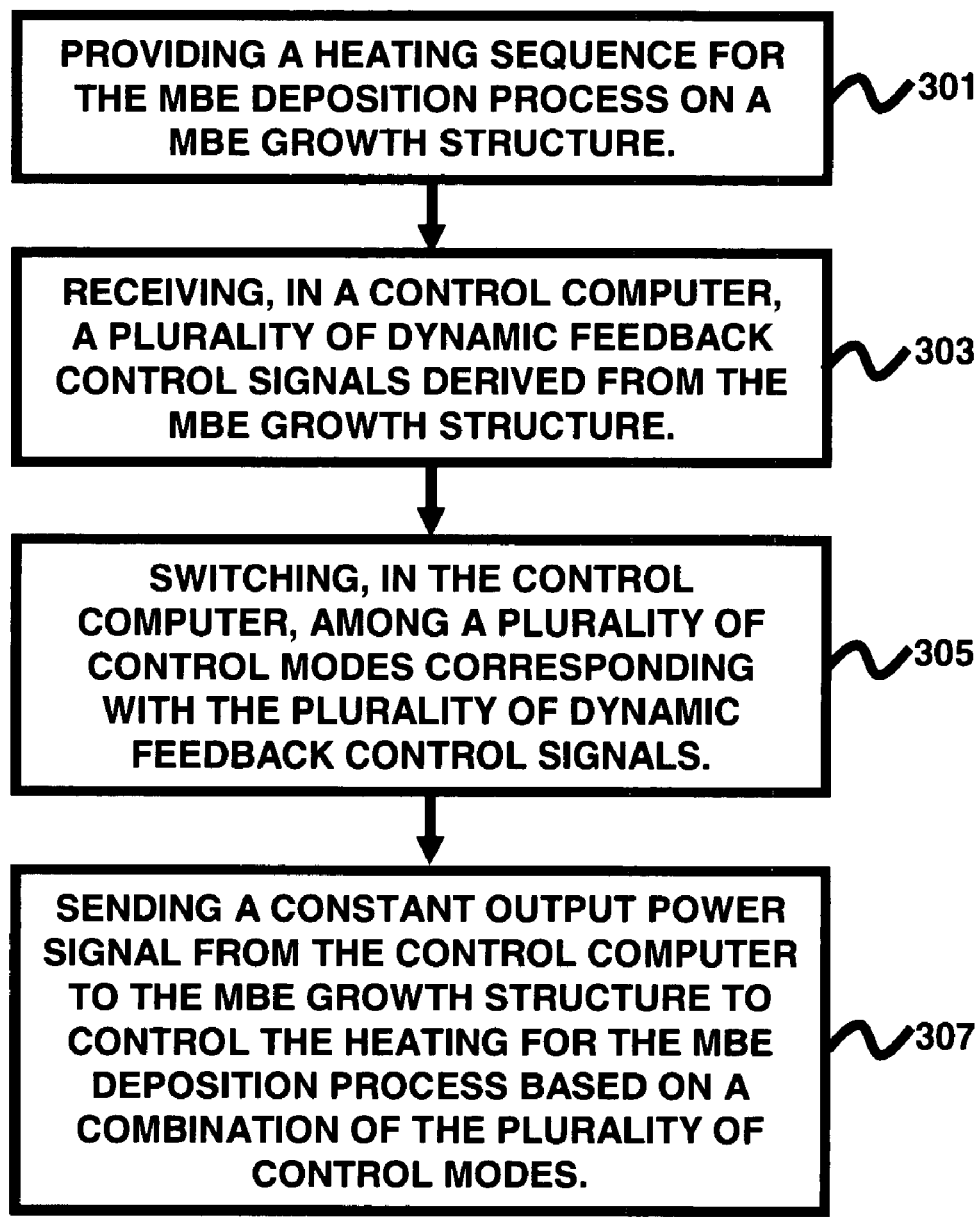

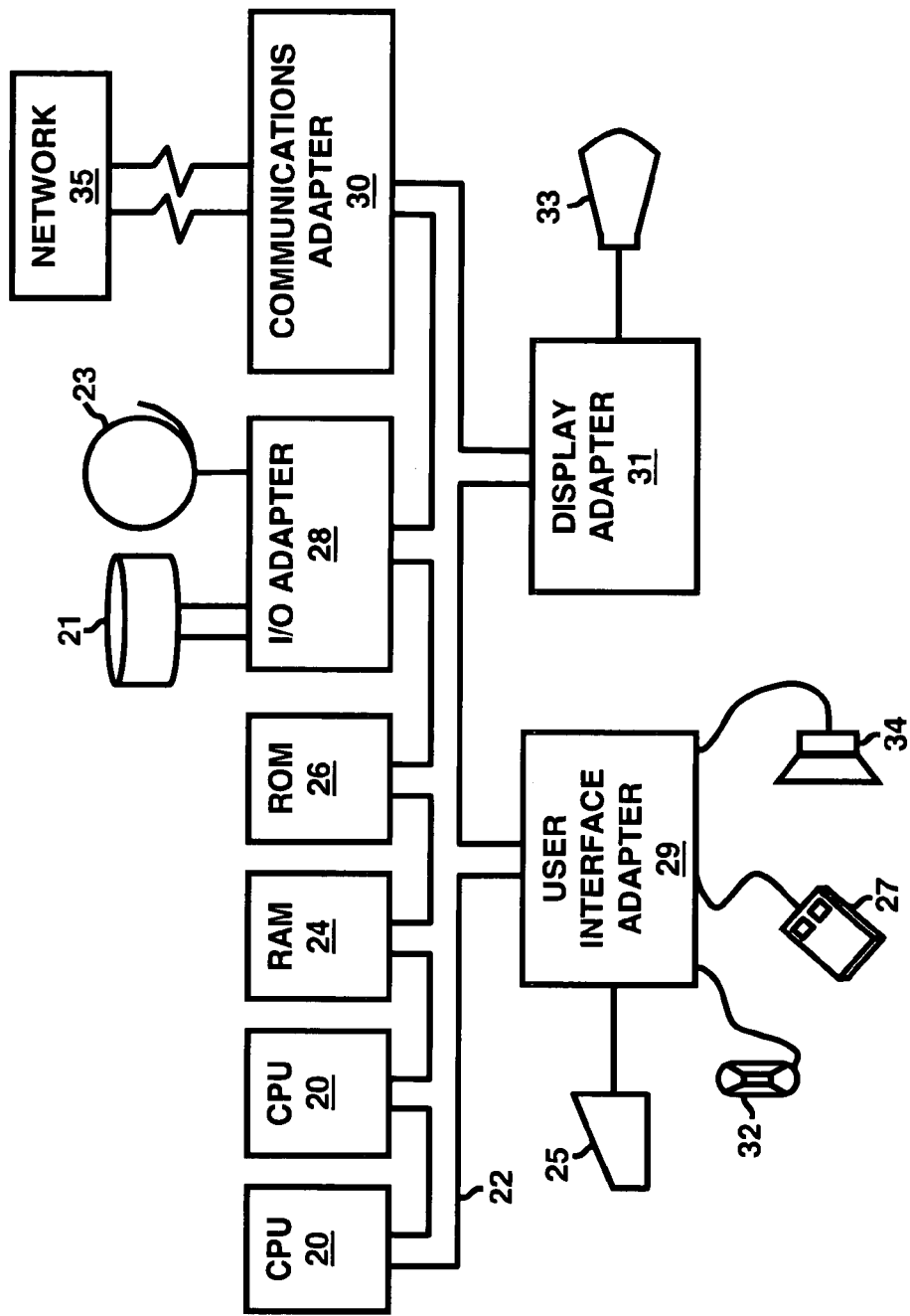

SUBSTRATE TEMPERATURE ACCURACY AND TEMPERATURE CONTROL FLEXIBILITY IN A MOLECULAR BEAM EPITAXY SYSTEM

CROSS REFERENCE TO RELATED APPLICATION

This application is a divisional application of and claims priority of U.S. Nonprovisional patent application Ser. No. 11/806,159 entitled "IMPROVED SUBSTRATE TEMPERATURE ACCURACY AND TEMPERATURE CONTROL FLEXIBILITY IN A MOLECULAR BEAM EPITAXY SYSTEM," by Stefan P. Svensson, filed May 30, 2007, now abandoned, which is incorporated herein by reference.

GOVERNMENT INTEREST

The embodiments described herein may be manufactured, used, and/or licensed by or for the United States Government without the payments of royalties thereon.

BACKGROUND

1. Field of the Invention

The embodiments herein generally relate to thermometry, and, more particularly, to methods for controlling growth temperatures in a molecular beam epitaxy system.

2. Description of the Related Art

Molecular Beam Epitaxy (MBE) is one of a family of methods used to grow single-crystal films on single crystal substrates (epitaxy). In an MBE system, a substrate, on which the crystalline film is to be grown, and several material sources are contained in an ultra-high vacuum chamber. The sources are typically furnaces, each containing a specific element to be deposited on the substrate. A furnace uses an open crucible in which the evaporant is placed. Moreover, resistive heating wires and heat shields generally surround the crucible. Generally, the evaporant is heated to a temperature that produces a material flux of desirable magnitude from the crucible opening (a molecular beam) and which is aimed towards the substrate crystal, where the molecules are allowed to condense. The beam is turned on and off by a mechanical shutter blade in front of the crucible opening. High stability of the flux, and therefore growth rate, is accomplished by high stability of the furnace temperatures.

In addition to stable source temperatures, a stable process relies on a well-controlled substrate temperature. The substrate is warmed by a resistively heated element placed behind it. Because the substrate should be allowed to rotate around its azimuthal axis during deposition to ensure good layer uniformity, there are generally inadequate solutions to mechanically contact the substrate for measurement of the temperature. Usually, a thermocouple is placed somewhere behind the substrate in the vicinity of the back side and the heater element. A substantial difference between the real temperature of the substrate front side and the thermocouple reading is therefore commonly observed. To achieve a stable temperature, a proportional integrating derivative (PID) control unit is typically used, which sets the output level from a power supply to the substrate heater, depending on the thermocouple reading. In many systems, the temperature set-points are set by a digital control computer, which also opens and closes the mechanical shutters in front of the evaporation sources for predetermined times, thus producing specific film thicknesses.

The difference between the thermocouple reading and the true temperature is generally determined empirically. The most common way of obtaining more reliable temperature readings is to use an optical pyrometer. Typically, it is first calibrated by observing some type of phase transformation that is known to take place at a well-defined temperature. The pyrometer is then adjusted by setting a value for the apparent emissivity of the substrate so that the instrument reads the desired value.

It is possible to use the pyrometer signal directly as input in the feed back loop. This could be accomplished by hard wiring the pyrometer to the PID controller, or by feeding it to the control computer and letting it send appropriate signals to the PID controller. However, in either case, the use of the pyrometer is limited to temperature ranges above several hundred degrees, typically above 400° C. Since the substrate is at room temperature at the start of the process, pyrometers are generally not useful during the initial warm up phase. Also, during the deposition phase some materials may require deposition at temperatures below 400° C. In addition, some films and some holders of small substrates are prone to let stray light from the evaporations sources enter the pyrometer, which can produce erroneous readings. In these cases thermocouple control, or constant power output are the preferred choices.

Finally, deposition of layers that aim to produce structures with optical interference properties, such as a Bragg mirror, can be used. During deposition of such films the signal reaching a pyrometer as well as the temperature observed by the thermocouple exhibit strong oscillations, making both generally unreliable and unsuitable for feedback control. Accordingly, there remains a need to improve the MBE deposition sequence via more accurate temperature control.

SUMMARY

In view of the foregoing, an embodiment herein provides a computer-implemented method of controlling temperatures while performing a MBE deposition process, and a program storage device readable by computer, tangibly embodying a program of instructions executable by the computer to perform a method of controlling temperatures while performing a MBE deposition process, wherein the method comprises providing a heating sequence for the MBE deposition process on a MBE growth structure; receiving, in a control computer, a plurality of dynamic feedback control signals derived from the MBE growth structure; switching, in the control computer, among a plurality of control modes corresponding with the plurality of dynamic feedback control signals; and sending an output power signal from the control computer to the MBE growth structure to control the heating for the MBE deposition process based on a combination of the plurality of control modes. Preferably, the plurality of dynamic feedback control signals comprises thermocouple signals and pyrometer signals. The method may further comprise receiving data related to material properties of the MBE growth structure; selecting temperature values based on the material properties of the MBE growth structure; heating the MBE growth structure based on the selected temperature values; growing crystals on the heated MBE growth structure; and cooling the MBE growth structure. Moreover, the method may further comprise performing a thermocouple calibration sequence on a thermocouple and a pyrometer monitoring the MBE growth structure. Furthermore, the method may further comprise setting PID control parameters in the control computer to set a level of the output power signal. Additionally, the method may further comprise establishing output power signal levels in the control computer; directly sending the output power signal levels from the control computer to a power supply unit; and controlling temperatures in the MBE deposition process based on the output power signal levels.

Another embodiment provides a control system for controlling temperatures while performing a MBE deposition process, wherein the control system comprises a MBE growth structure; a heater adapted to provide heat for the MBE deposition process on the MBE growth structure; and a control computer adapted to receive a plurality of dynamic feedback control signals derived from the MBE growth structure; switch among a plurality of control modes corresponding with the plurality of dynamic feedback control signals; and send an output power signal to the heater to control the heating for the MBE deposition process based on a combination of the plurality of control modes. In one embodiment, the plurality of dynamic feedback control signals comprises thermocouple signals and pyrometer signals. Preferably, the control computer is further adapted to receive data related to material properties of the MBE growth structure; select temperature values based on the material properties of the MBE growth structure; and send power signals to the heater to allow heating of the MBE growth structure based on the selected temperature values, wherein crystals are grown on the heated MBE growth structure. Moreover, in one embodiment, the control system may further comprise a thermocouple and a pyrometer adapted to monitor the MBE growth structure, wherein the control computer is further adapted to perform a thermocouple calibration sequence on the thermocouple and the pyrometer. Preferably, the control computer is further adapted to set PID control parameters to set a level of the output power signal. Additionally, the control system may further comprise a power supply unit, wherein the control computer is further adapted to establish output power signal levels; directly send the output power signal levels to the power supply unit; and control temperatures in the MBE deposition process based on the output power signal levels. Moreover, the MBE growth structure may comprise a substrate wafer. In another embodiment, the control system further comprises a thermocouple and a non-contact temperature monitor adapted to monitor the MBE growth structure, wherein the control computer is further adapted to perform a thermocouple calibration sequence on the thermocouple and the non-contact temperature monitor.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which:

FIG. 7 is a flow diagram illustrating a preferred method of an embodiment herein; and FIG. 8 is a computer system diagram according to an embodiment herein.

DETAILED DESCRIPTION OF PREFERRED EMBODIMENTS

Figure 1:
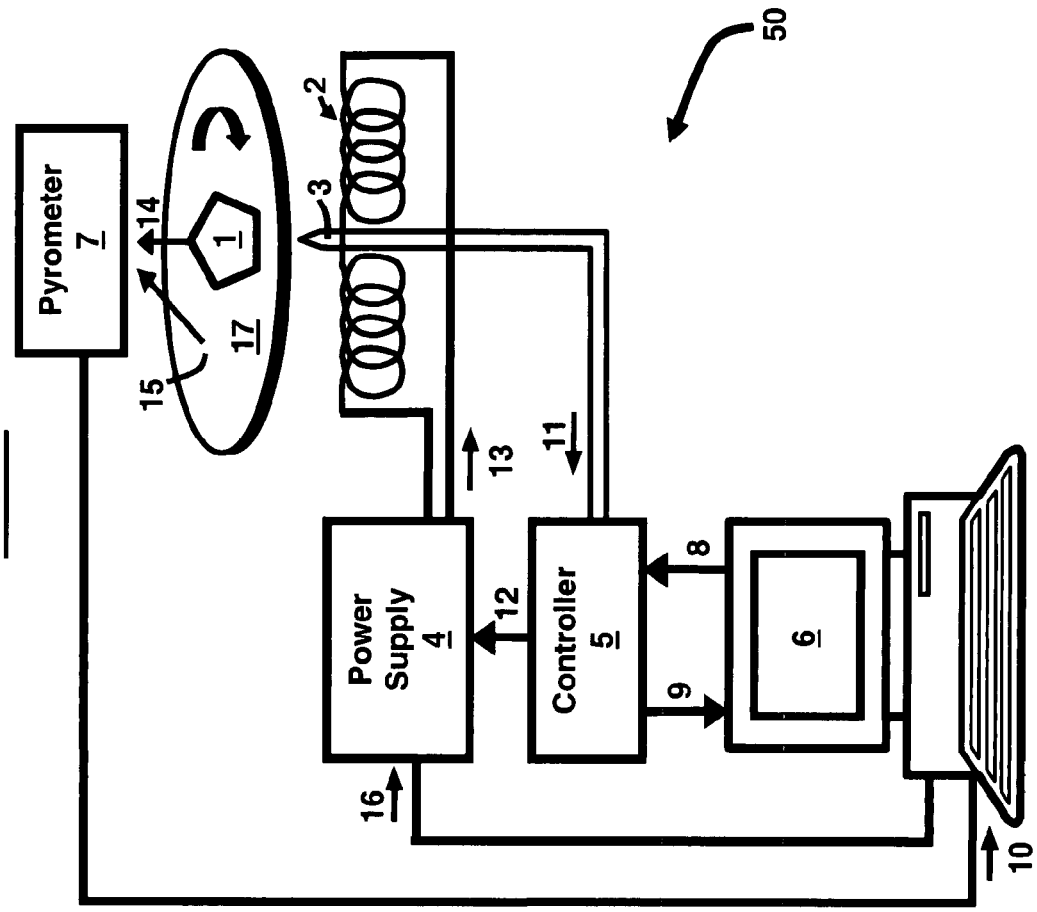
FIG. 1 illustrates a schematic diagram of a hardware configuration according to an embodiment herein.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

As mentioned, there remains a need to improve the MBE deposition sequence via more accurate temperature control. The embodiments herein achieve this by providing a technique to feed a constant power level to the substrate heater and to use more than one feedback signal and more than one control mode during an MBE deposition sequence. Referring now to the drawings, and more particularly to FIGS. 1 through 8, where similar reference characters denote corresponding features consistently throughout the figures, there are shown preferred embodiments.

An exemplary hardware embodiment is shown in FIG. 1. A substrate wafer 1 of arbitrary shape is rotated around its azimutal axis during deposition. The substrate wafer 1 is held in place by a wafer holder 17. Behind the substrate wafer 1 is a resistive heater 2 and a thermocouple 3, none of which are in intimate contact with the substrate wafer 1 or its holder 17. The heating is accomplished by an electric power supply 4, which receives information about the desired output power level from a hardware controller 5, for example a PID controller, such as that available from Eurotherm, Virginia, USA is preferably used. Such a hardware controller 5 is used in conjunction with a control computer 6 that can send set points and PID values to the hardware controller 5. Accordingly, the controller 5 is connected to the computer 6. Additionally, a control cable 16 may be connected from the computer 6 directly to the power supply 4. An optical pyrometer 7 is positioned so that it can capture radiation from the substrate wafer 1. A pyrometer 7 is just one example of an optical, or even more generic, a non-contact temperature monitor that is assumed to able to read the "true" temperature of the substrate wafer 1. The embodiments herein include a feature for self-calibration of the pyrometer (or any other optical or otherwise non-contact temperature monitor) 7 versus the thermocouple 3 or constant power output as further described below.

The signal flow 8 from the computer 6 to the controller 5 may comprise any of the following: PID parameters such as proportional, derivative and integration constants, temperature setpoints ($T_{TC\text{-}setp}$), and output power values. The signal flow 9 to the computer 6 from the controller 5 may comprise actual thermocouple temperatures ($T_{TC\text{-}actual}$). The computer 6 also inputs values taken from a temperature signal 10 from the pyrometer 7. The analog input 11 to the controller 5 from the system includes voltage from the thermocouple 3. The output signal 12 from the controller 5 to the power supply 4 is a percentage value of the total available power. The output signal 13 from the power supply 4 comprises voltage and current. Finally, the pyrometer 7 converts heat 14 radiated from the substrate wafer 1 to the temperature signal 10. If the substrate wafer 1 is configured very small, heat from areas 15 surrounding the actual wafer 1 or heat/light from other objects reflected from areas 15 may also enter the pyrometer 7, which may cause erroneous readings, which is further described below.

The embodiments herein use a feature of the hardware controller 5 that allows bypass of the hardware PID control and allows the hardware controller 5 to output a constant power level that can be set by the control computer 6. Preferably, a PID control routine is implemented in software on the control computer 6, which can read both the signal 9 from the hardware controller 5 as well as the temperature signal 10 from the pyrometer 7. It is possible, during a complex deposition sequence, to switch dynamically between three different control modes: 1) thermocouple feedback; 2) pyrometer feedback; and 3) constant power. In addition, PID control parameters can be assigned dynamically during deposition to optimize the temperature response of the substrate wafer 1.

When the control cable 16 is added between the computer 6 and the power supply 4, output power levels can be sent directly to the power supply 4 via the control cable 16, thereby bypassing the controller 5. The functionality of the controller 5 and the computer 6 differ from the conventional systems. Generally, more of the decision-making and control work is moved from the low-level hardware controller 5 to the computer 6. This enables dynamic switching between the different control modes (described above) during a process sequence.

Generally, in the conventional systems, the function of a control computer is limited to reading the signal from the pyrometer, and sending PID parameters and thermocouple set points to the controller. A low-level controller accepts the PID parameters and thermocouple set points, inputs the thermocouple voltage and translates it into a temperature value, $T_{TC-actual}$, calculates the output percentage and sends the value to the power supply.

Conversely, according to the embodiments herein, the action of calculating the output percentage is moved up in the control hierarchy to the control computer 6. The actual thermocouple temperature is not only read in to the computer 6 from the controller 5 for display purposes, but may be used in the output power calculation routine. A second option is to use the signal 10 from the pyrometer 7 in this calculation. A third option is to bypass the calculation and set a fixed output percentage via the controller 5 or directly to the power supply 4 via the direct connection afforded by the control cable 16. In the configuration provided by the embodiments herein, the power level to be output by the power supply 4 is set via the controller 5 in the form of a percent level command. In the direct control configuration (i.e., using the control cable 16) the output power level can be set by direct command from the control computer 6.

No hard rewiring is needed for the embodiments herein to function. Moreover, the direct connection (i.e., using the control cable 16) between the computer 6 and the power supply 4, and comprising the addition of one serial communication control cable 16, does not interfere with the operation of the system 50. With the hardware controller 5, only a reprogramming of the communications protocol and pressing a front panel switch (not shown) (from auto to manual) are required. It is possible that these actions can be performed by the control computer 6. The same configuration can also be used for control of an evaporation cell (not shown). If so, the pyrometer 7 is eliminated and the substrate wafer 1 is replaced by a crucible (not shown) containing the evaporant.

Figure 2:
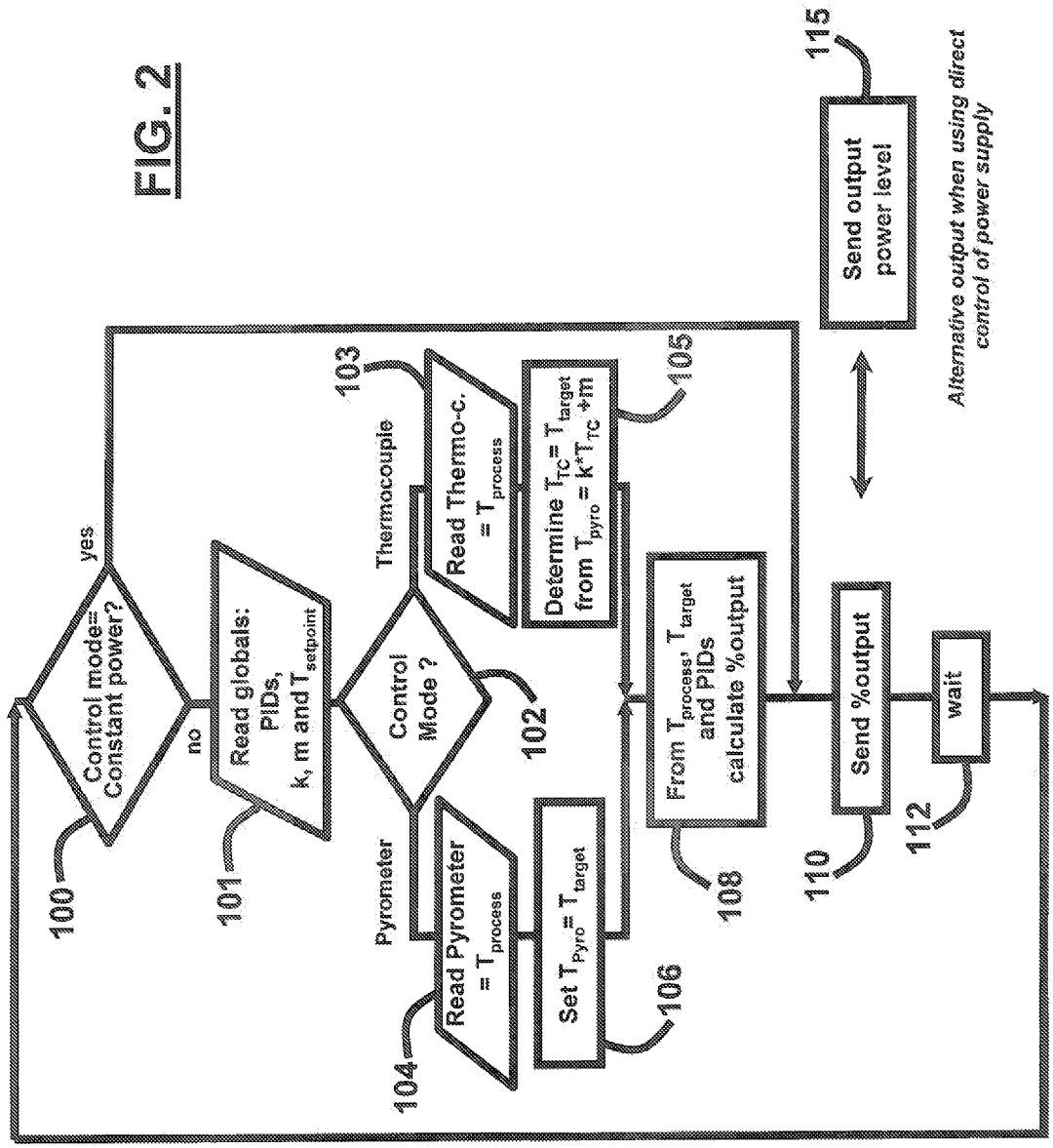
FIGS. 2 through 5 are flow diagrams illustrating methods according to the embodiments herein.

The core of the software program, which is run on computer 6 (of FIG. 1) is a continuously running routine that performs the PID control as depicted in FIG. 2. Specifically, FIG. 2 shows a constantly running loop, the purpose of which is to set the correct output power using either of the three control modes. First, a check is performed to see if constant power is used (100). If this is the case, a jump occurs directly to the point where the output power is set (110). If constant power is not to be used, the global control parameters are read in to enable update in case they have been changed by higher-level processes (101). Next, a check for thermocouple or pyrometer mode is performed (102). If pyrometer control is the chosen mode, the current pyrometer signal is read (104), then the pyrometer control temperature is set equal to the target temperature (106). If thermocouple control is to be used, the current thermocouple reading is obtained (103). Subsequently, the thermocouple temperature is translated to a real temperature, which is defined as one given by the pyrometer (or any other optical measurement technique) 7 (of FIG. 1) via the experimentally determined relationship between the two (in this case a linear one) (105). Once the new target and current real temperatures have been determined, they are used in a PID calculation to determine the needed output power at that instance in time (108). Next, the calculated output power level is sent to the low level controller (110) or, in the case when the control computer is direct connected to the power supply, a corresponding number is sent to low level controller (115). Finally, the process is halted for a short system-dependent time interval (112) to allow the control event to act before the cycle starts over.

A low system priority is provided so as not to interfere with more time-critical processes, such as opening and closing shutters (not shown). The software routine continuously monitors a set of global variables which are a) the desired temperature setpoint, ($T_{setpoint}$); b) the control mode (equals control by pyrometer 7 (of FIG. 1), control by thermocouple 3 (of FIG. 1) or constant power output); and c) the PID values. Higher level programs control the temperature by setting new values for the global variables. Instantaneous changes in temperature are accomplished by setting a new value for the temperature setpoint. Gradual changes in temperature are accomplished by invoking routines that execute a set of stepwise temperature changes with specific time delays. More complex process sequences are built up from combinations of such functions.

Another feature of the preferred embodiments is the ability to switch dynamically between the three different control modes: control by thermocouple 3, control by pyrometer 7, and constant output power 13. With respect to FIG. 1, in the following examples, it is assumed that the signal 10 from the pyrometer 7 represents the true temperature. It is, however, possible to substitute the signal 10 from the pyrometer 7 with a signal from any other type of instrument that can provide reliable information about the temperature of the sample.

Next, with respect to the deposition process for a small-size, semiconductor sample with a small bandgap, the following describes the outgassing and film growth on a sample of such a small size that stray light may make the signal 10 from the pyrometer 7 unreliable at lower temperatures. Furthermore, a material is chosen, in this case GaSb, which requires a relatively low deposition temperature, which is below the operating temperature of the pyrometer 7. Although GaSb is chosen as an example, the method can be applied to any other material with similar characteristics.

Figure 3:
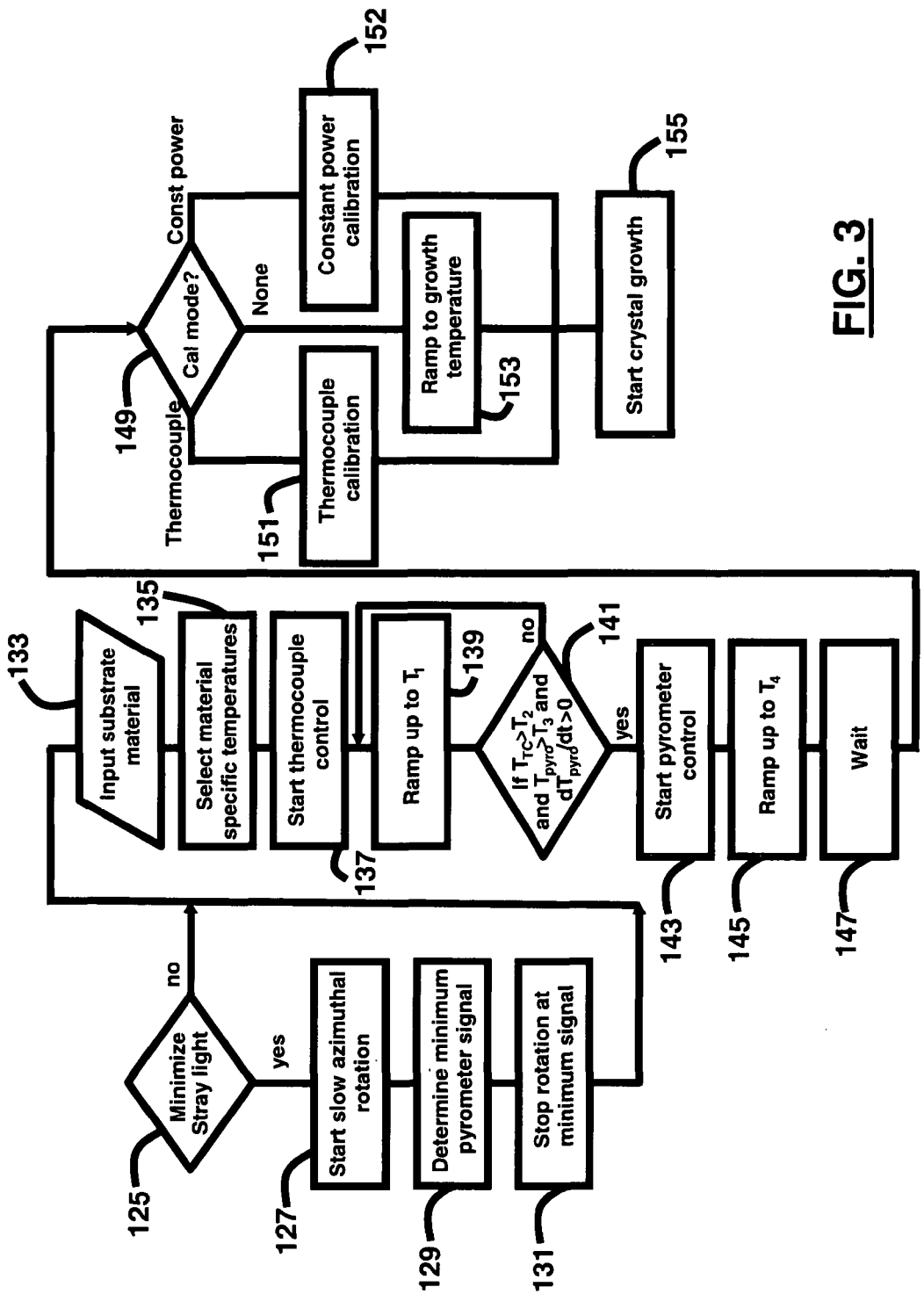

A flowchart of the preparation and calibration process is shown in FIG. 3 (with reference to FIG. 1). The first step in the process is a decision point (125) at which it is determined if the stray light to the pyrometer 7 (of FIG. 1) should be minimized. If this is the case, the sample rotation is first set to a slow value such that a significant number of pyrometer readings can be obtained with a suitable azimuthal angular resolution (127). Next, pyrometer signals are sampled for long enough time interval to cover a 360 degree rotation of the sample. The minimum pyrometer value in this data set is determined (129) and the rotation continues until the same value is again read by the pyrometer 7 (of FIG. 1), at which point the rotation is stopped (131). The position of the wafer 1 (of FIG. 1) is now suitable and information about the substrate material is sought (133). This could be in the form of an interactive question to the operator or provided via higher level control processes that call this routine. Based on the choice of material, a suitable set of temperatures and control parameters are called up from a memory component of computer 6 (135). Since the process starts at room temperature, at which the pyrometer 7 (of FIG. 1) does not work, the initial control is set to thermocouple mode (137).

The substrate wafer 1 is then ramped up to a target temperature, $T_1$ (139), which is higher than $T_2$ and $T_3$, which are further explained below. A loop is then started, in which the temperature signal 10 (of FIG. 1) is monitored to determine if it is providing reliable information (141). The criteria for this is that the thermocouple temperature should be higher than some value $T_2$, below which there is no reason to even check for signal 10 (of FIG. 1) because the substrate wafer 1 is transparent. The next criterion is that the pyrometer reading should be higher than $T_3$, which is its minimum reliable temperature (specific to the instrument). Finally, the time derivative $dT_{pyro}/dt$ must be positive, or in other words the temperature must be increasing. Typically, the pyrometer temperature reading as a function of time shows initially a decreasing behavior, when the substrate wafer 1 (of FIG. 1) is transparent. The pyrometer temperature reading then reaches a minimum at $T_3$ when the substrate wafer 1 (of FIG. 1) starts to become opaque and then exhibits an increase as the reading starts being dominated by the radiation from the surface of the substrate wafer 1 (of FIG. 1), which is then the real temperature). When these criteria are met, the system 50 (of FIG. 1) switches to pyrometer control (143). The wafer 1 (of FIG. 1) is then ramped up (145) to a material-specific value, $T_4$, above the temperature at which the oxide desorbs and which is suitable for thermal cleaning This thermal cleaning is then allowed to continue for a suitable, material-specific time (147). After this, a decision point (149) determines if a calibration should be performed to determine the relationship between the pyrometer readings and the thermocouple or constant power values, or no calibration is needed at all. If no calibration is needed a simple down-ramp to the growth temperature under pyrometer control is started (153). If a thermocouple calibration is selected this process is started (151), similarly if a constant power calibration is selected this is started (152). Both of these processes are further described in FIG. 4. Finally, the crystal growth is started (155).

The preparation of a GaSb wafer 1 includes a heating sequence that takes the temperature up from room temperature, to a value above which the native oxide desorbs, which for GaSb is approximately 600° C. The initial temperature ramp targets a value, $T_1$, which is chosen to be higher than the values $T_2$ and $T_3$, as further described below. At room temperature the pyrometer 7 cannot be used since the wafer 1 does not appear opaque to the instrument, nor does it emit enough light to produce a signal detectable by typical available instruments. Thermocouple feedback is therefore used. The control computer 6 monitors the signals from both the thermocouple 3 and the pyrometer 7 and switches the input signal 11 when a set of criteria are met. These criteria include: thermocouple signal 11 greater than $T_2$, (an empirically determined value that depends on the heating efficiency of the particular system heater configuration and the wafer material properties), signal 10 greater than $T_3$ (the minimum reliable output temperature of the pyrometer), and the time derivative of the signal 10 greater than zero (i.e. the temperature is verified to be increasing).

Before the thermocouple-based upramp is started, the apparent signal from the pyrometer 7 can be monitored as a function of azimuthal orientation of the substrate holder 17. With the substrate wafer 1 and holder 17 at room temperature, any elevated temperature signal 10 from the pyrometer 7 is due to spurious stray light from other hot objects in the growth chamber (not shown). Because the substrate holder 17 normal is not necessarily perfectly aligned with the axis of the pyrometer 7, and various hot cells such as dimer-crackers for Group V cells are off-axis relative to the pyrometer 7, there are azimuthal angels at which the reflected stray light is minimized (or maximized). The heating sequence can therefore be started with a short time sequence, during which the azimuthal rotation speed is set to a low value, and the length of the sequence is chosen so that at least one full turn is completed. During this time the signal 10 is recorded. The minimum signal value is found by the computer 6 and the azimuthal rotation is continued. The control computer 6 then continues to monitor the signal 10 but stops the rotation when the signal 10 again reaches the minimum value. This sequence assures that the error in the signal 10 is minimized. For larger wafers, uniform heating, which is accomplished by continuous rotation, is more important, but since the stray light from the holder 17 is then much lower, the optimization feature can be bypassed.

After the oxide has desorbed, the temperature is further raised a few ten degrees to $T_4$, to clean the substrate by thermal outgassing. It remains at this level for a few minutes after which the temperature is lowered to a value suitable for deposition and crystal growth, $T_{growth}$. The temperatures, $T_4$ and $T_{growth}$, are chosen empirically for each type of substrate wafer 1 and the desired outcome of the process, using separate optimizations. According to the embodiments, the down ramp can be broken into stages that generate a relationship between the signal 10 and the reading of the thermocouple 3 or the amount of power sent to the heater 2. This calibration relationship can then be used for control during the subsequent film growth if the signal 10 is deemed to be unreliable, either because of stray light, or because the growth temperature might be below the operating range of the pyrometer 7 (as shown in the last stages in FIG. 3). The calibration sequence can also be repeated an arbitrary number of times and at arbitrary interruption points during the film growth, if it can be expected that the relationship has changed by the presence of the deposited film. An example of this would be InGaAs deposition on InP, which increases the absorption of the wafer/epi film combination such that less heat is required to maintain a certain surface temperature, which is registered by the thermocouple 3 (of FIG. 1) as a lower reading.

The down-ramp is broken into steps—a minimum of two—and preferably four. For each step the temperature is lowered under pyrometer control until a predetermined value is reached. It is then held at this level while the thermocouple temperature, or power level, is monitored. When the time derivative of the thermocouple signal is zero, the system 50 (of FIG. 1) is assumed to be in equilibrium and the values from the two temperature monitors are recorded. If instead the power output is recorded, a time averaging is done as shown in FIG. 4.

Figure 4:
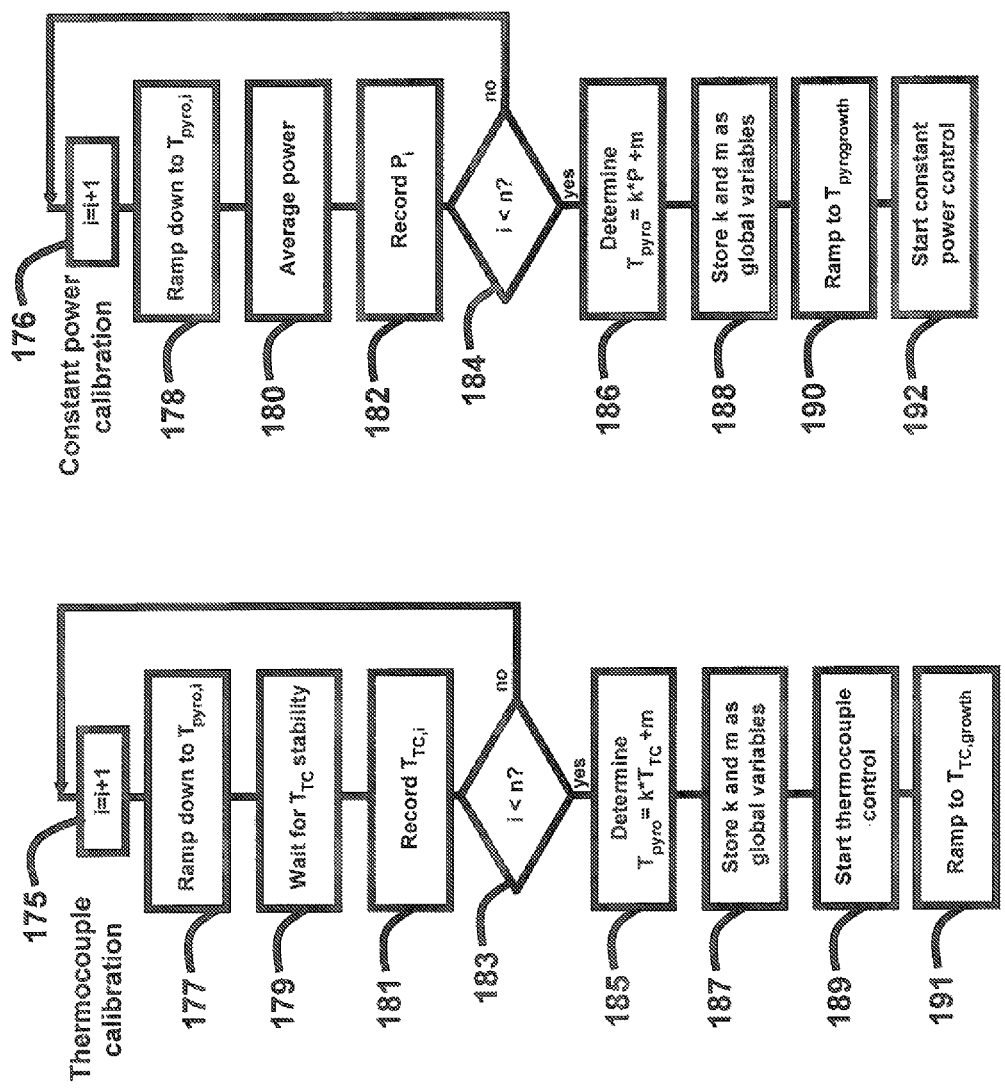

In FIG. 4, the calibration of the thermocouple 3 (of FIG. 1) begins with a step counter update (175). The counter counts the number of steps that will be used in the calibration. The temperature of the substrate wafer 1 (of FIG. 1) is then ramped down to a preset value $T_{pyroj}$ (177). The temperature of the thermocouple 3 (of FIG. 1) is then monitored (179). The temperature reading exhibits an initial fast drop, and after a short period of time, slowly comes to a steady state when the wafer 1 (of FIG. 1) and heater 2 (of FIG. 1) reach equilibrium. When the change in the thermocouple reading as a function of time reaches a preset small value, the system 50 (of FIG. 1) is considered to be in equilibrium and the pair of thermocouple and pyrometer values are recorded (181). This process is repeated n times (183). Once the entire set of temperature pairs has been determined, a least square fit is obtained (185). In the general case, any functional relationship could be determined. The parameters that describe the functional relationship, in the case of a straight line, the slope, k, and the intercept, m, are stored as global variables (187). The control mode is then switched to thermocouple (189) and a ramp started to the growth temperature (191).

The procedure for constant power versus pyrometer calibration proceeds in a substantially similar manner as also illustrated in FIG. 4. The calibration starts with a step counter update (176). The counter counts the number of steps that will be used in the calibration. The temperature of the substrate wafer 1 (of FIG. 1) is then ramped down to a preset value $T_{pyroj}$ (178). The output power is then averaged to obtain a reliable number (180). The pair of thermocouple and power values are then recorded (182). This process is repeated n times (184). Once the entire set of temperature pairs has been determined, a least square fit is obtained (186). In the general case, any functional relationship could be determined. The parameters that describe the functional relationship, in the case of a straight line, the slope, k, and the intercept, m, are stored as global variables (188). The pyrometer control mode is then maintained and a ramp started to the growth temperature (190). Finally, the control mode is changed to constant power mode (192).

When the whole set of steps have been completed, a functional relationship is determined. This could be any function that can be determined from the given number of observations. Again, with respect to FIG. 1, the simplest relationship, which works very well for pyrometer and thermocouple calibration, is a linear one, in which case a least squares fit is performed on the data set of the signal 10 and the values of the thermocouple 3.

$$T_{pyro}=k*T_{TC}+m$$

Figure 5:
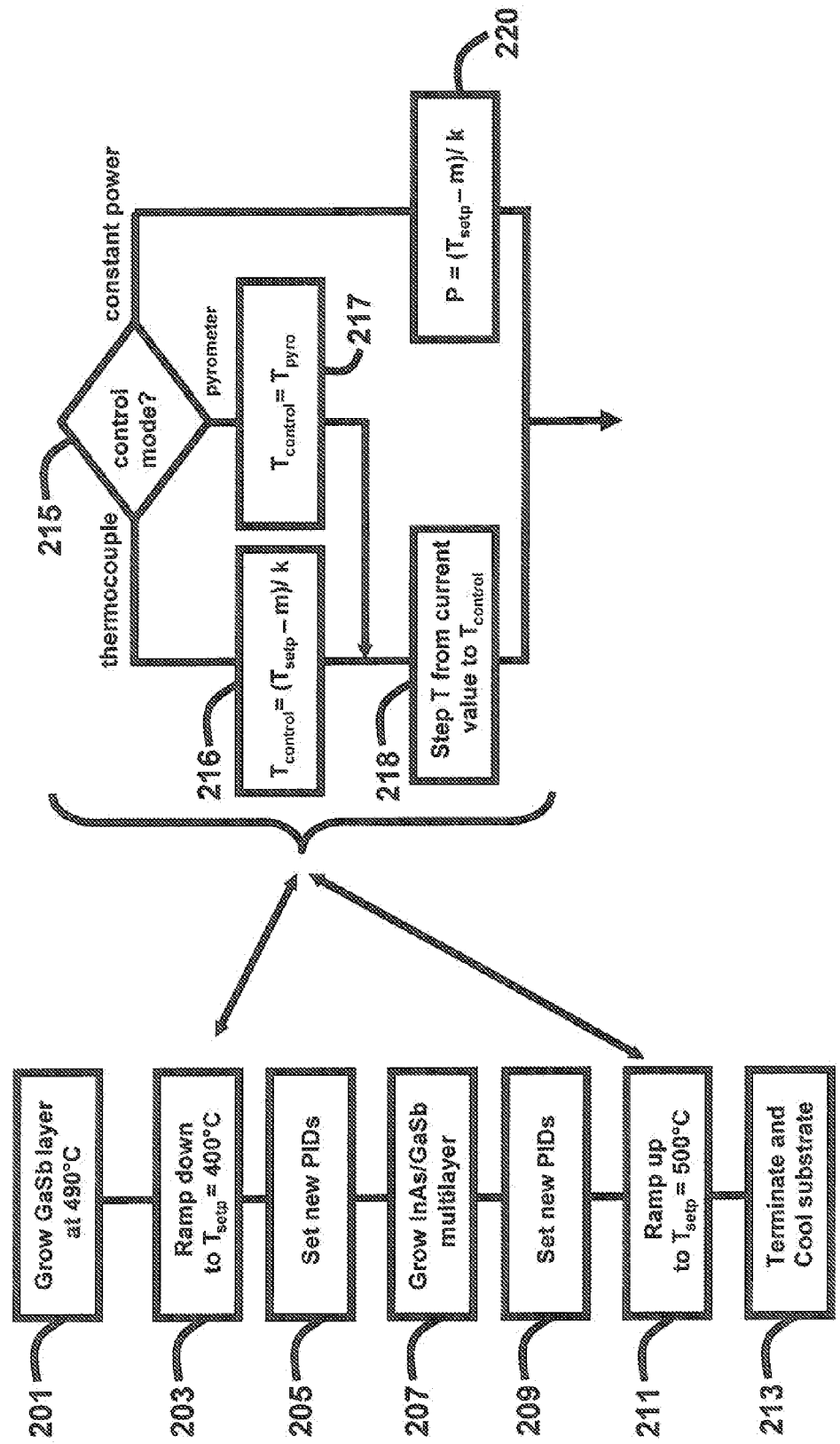

In the case of constant output power as a function of signal 10, a linear relationship also works surprisingly well. However, it is not obvious that this would be the case in an arbitrary system, in which case a more complex relationship may have to be found. The values of the slope, k, and the intercept, m, are stored in global variables in the control system, accessible by any other routine. Similarly, more fitting parameters would be stored and accessed in the case when more complex functions are used. As mentioned, the pyrometer signal 10 is assumed to represent the true temperature. However, since the deposition temperature of the GaSb wafer 1, in this case, will be lower than the minimum reliable temperature of the pyrometer 7 and some of the deposition sequence will be done using sources that produce excessive amounts of stray light, this process may use thermocouple feedback, or constant power. The flowchart for the high-level process is shown in FIG. 5.

The growth of the wafer 1 (of FIG. 1) begins with the growth of GaSb at a temperature of 490° C. (201). Next, the temperature is ramped down to 400° C. (203). The details of this process are described below. Before growth is started at the lower temperature, new PID values may be set to optimize the stability of the temperature control at this level (205). Next, a multilayer structure is grown (for example, the multilayer structure may include alternating layers of InAs and GaSb) (207). Once the multilayer sequence is completed, the PID values may be changed back to numbers more appropriate for control of the temperature at higher levels (209). Then, the temperature is ramped up, in this case to a value of 500° C. suitable for annealing of the wafer 1 (211). Finally, the growth process is terminated and the substrate wafer 1 (of FIG. 1) is cooled down (213). The ramping events (203) and (211) comprise a sequence of events aimed at invoking the correct control modes. An initial check is performed of which one of the three modes (thermocouple, pyrometer, or constant power) is to be used (215). If constant power is chosen, the power level corresponding to the end target temperature of the ramp is calculated and set. This includes a wait time to ensure stability (220). If pyrometer control is used, the target temperatures are set equal to pyrometer values (217). If thermocouple control is used, the target temperatures are translated to thermocouple values (216), in this case using the linear relationship determined during the calibration sequence describe in FIG. 4. Finally, the temperature set points are changed stepwise to accomplish the ramp (218).

Figure 6:
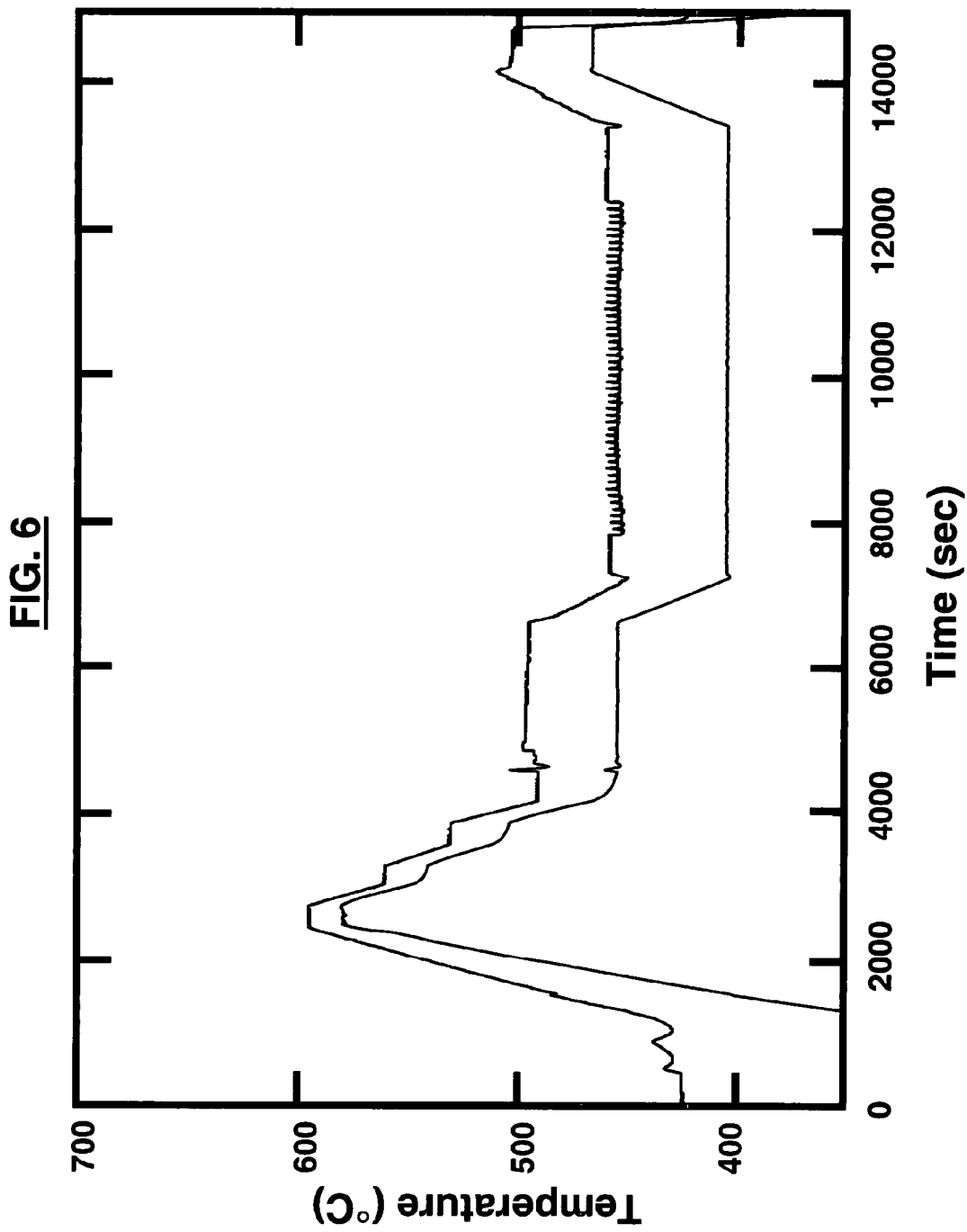
FIG. 6 is a graphical representation illustrating temperature results as a function of time for a film deposition sequence according to an embodiment herein.

The two temperature changes include a check of control mode, a calculation of the control setpoint, and a ramp, changing the temperature to the new setpoint. In FIG. 5, two changes of PID set points are also included that may be introduced to optimize stability or agility at specific stages of the process. An example of the real temperatures during a deposition sequence is shown in FIG. 6. This demonstrates the result of first running the process described in FIG. 3 and FIG. 4 and immediately afterwards running the process in FIG. 5.

The upper curve in FIG. 6 shows the recorded pyrometer temperature as a function of time and the lower one the thermocouple values. From 0 seconds to approximately 1,200 seconds the pyrometer signal represents transmitted light from the heater 2 (of FIG. 1) through the substrate wafer 1 (of FIG. 1) and is consequently not used for control. At approximately 1,800 seconds the control is handed over to the pyrometer 7 (of FIG. 1) and the ramp to 600° C. is continued. At approximately 3,000 seconds the stepwise down ramp under pyrometer control is started and thermocouple readings are recorded. This represents the calibration of pyrometer versus thermocouple process. At approximately 4,500 seconds the control mode is changed to thermocouple control. Shortly afterwards the growth is started by Ga and Be shutters being opened. These reveal stray light from the ovens that is visible as an increase in the pyrometer signal and may produce incorrect temperature control if this were used for feedback. At approximately 7,000 seconds the growth is interrupted and a down ramp process begins. Between 8,000 and 12,500 seconds a multilayer is deposited at the lower substrate temperature. Alternating levels of stray light is again visible in the pyrometer signal 10 (of FIG. 1) while the thermocouple level remains flat. At approximately 13,500 seconds the temperature is ramped up and held at a higher annealing temperature (500° C.) until shortly before 15,000 seconds, when the process is terminated by shutting off the power of the heater 2 (of FIG. 1), resulting in a rapid temperature drop.

FIG. 7, with reference to FIGS. 1 through 6, illustrates a flow diagram of a computer-implemented method of controlling temperatures while performing a MBE deposition process, wherein the method comprises providing (301) a heating sequence for the MBE deposition process on a MBE growth wafer 1; receiving (303), in a control computer 6, a plurality of dynamic feedback control signals 10 derived from the MBE growth wafer 1; switching (305), in the control computer 6, among a plurality of control modes corresponding with the plurality of dynamic feedback control signals 10; and sending (307) an output power signal 8 from the control computer 6 to the MBE growth wafer 1 to control the heating for the MBE deposition process based on a combination of the plurality of control modes.

The embodiments herein can include both hardware and software elements. In the software embodiment includes but is not limited to firmware, resident software, microcode, etc. Furthermore, the embodiments herein can take the form of a computer program product accessible from a computer-usable or computer-readable medium providing program code for use by or in connection with a computer or any instruction execution system. For the purposes of this description, a computer-usable or computer readable medium can be any apparatus that can comprise, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output (I/O) devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

A representative hardware environment for practicing the embodiments of the invention is depicted in FIG. 8. This schematic drawing illustrates a hardware configuration of an information handling/computer system in accordance with the embodiments of the invention. The system comprises at least one processor or central processing unit (CPU) 20. The CPUs 20 are interconnected via system bus 22 to various devices such as a RAM 24, read-only memory (ROM) 26, and an input/output (I/O) adapter 28. The I/O adapter 28 can connect to peripheral devices, such as disk units 21 and tape drives 23, or other program storage devices that are readable by the system. The system can read the inventive instructions on the program storage devices and follow these instructions to execute the methodology of the embodiments of the invention. The system further includes a user interface adapter 29 that connects a keyboard 25, mouse 27, speaker 34, microphone 32, and/or other user interface devices such as a touch screen device (not shown) to the bus 22 to gather user input. Additionally, a communication adapter 30 connects the bus 22 to a data processing network 35, and a display adapter 31 connects the bus 22 to a display device 33 which may be embodied as an output device such as a monitor, printer, or transmitter, for example.

The embodiments herein provide more precise control of the temperatures used in an MBE process. The substrate temperature, which may be critical for the quality of the grown crystal, can be set in an optimum way, even when artifacts are present in the signals from various temperature reading sources. An optimum feedback mode can be set dynamically during the deposition process so as to minimize artifacts. An optical temperature monitor, such as a pyrometer 7, is used as an indicator of true temperature (by definition) and its values are related to corresponding readings of a thermocouple 3 or the power level. The embodiments herein can be used to control an MBE evaporation source by performing the PID control in software rather than by a low level controller 5 or by setting constant power levels, when thermocouple feedback is not possible (e.g., during mechanical failures).

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A computer-implemented method of controlling temperatures while performing a molecular beam epitaxy (MBE) deposition process, said method comprising:
    providing a heating sequence for said MBE deposition process on a MBE growth structure comprising a substrate wafer having one or more layers;
    receiving continually, in a control computer having hardware and software, a plurality of dynamic feedback control signals derived from said MBE growth structure consisting of constant power, thermocouple and pyrometer modes;
    switching, in said control computer, among a plurality of said control modes corresponding with said plurality of dynamic feedback control signals to optimize the temperature response to the substrate wafer; and
    sending an output power signal from said control computer to said MBE growth structure to control said heating for said MBE deposition process based on a combination of said plurality of control modes.

2. The method of claim 1, further comprising:
    receiving data related to material properties of said substrate wafer of a material having a deposition temperature below the operating temperature of the pyrometer;
    selecting temperature values based on said material properties of said substrate wafer;
    heating said substrate wafer based on the selected temperature values;
    growing crystals on the heated substrate wafer; and
    cooling said substrate wafer.

3. The method of claim 1, further comprising performing a thermocouple calibration sequence on a thermocouple and a pyrometer monitoring said MBE growth structure.

4. The method of claim 1, further comprising setting proportional integrating derivative (PID) control parameters in said control computer to set a level of said output power signal.

5. The method of claim 1, further comprising:
establishing output power signal levels in said control computer;
directly sending said output power signal levels from said control computer to a power supply unit; and
controlling temperatures in said MBE deposition process based on said output power signal levels.

6. The method of claim 2, wherein said substrate wafer is made out of a layer of GaSb and the MBE growth begins at 490° C., which temperature is reduced to 400° C.

7. The method of claim 6, wherein said substrate wafer contains an additional layer of InAs and is subsequently annealed at 500° C.

8. The method of claim 2, wherein the deposition temperature is below 400° C.

* * * * *